United States Patent
Shankar et al.

(10) Patent No.: US 10,472,716 B1
(45) Date of Patent: Nov. 12, 2019

(54) SHOWERHEAD WITH AIR-GAPPED PLENUMS AND OVERHEAD ISOLATION GAS DISTRIBUTOR

(71) Applicant: Lam Research Corporation, Fremont, CA (US)

(72) Inventors: Nagraj Shankar, Tualatin, OR (US); Jeffrey D. Womack, Lake Oswego, OR (US); Meliha Gozde Rainville, Lake Oswego, OR (US); Emile C. Draper, Molalla, OR (US); Pankaj G. Ramnani, Tigard, OR (US); Feng Bi, Cupertino, CA (US); Pengyi Zhang, Tigard, OR (US); Elham Mohimi, Hillsboro, OR (US); Kapu Sirish Reddy, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/982,913

(22) Filed: May 17, 2018

(51) Int. Cl.
*C23C 16/455* (2006.01)
*H01L 21/02* (2006.01)

(52) U.S. Cl.
CPC .... *C23C 16/45548* (2013.01); *H01L 21/0228* (2013.01)

(58) Field of Classification Search
CPC ........... H01L 21/0228; C23C 16/45548; C23C 16/45519; C23C 16/45565
See application file for complete search history.

(56) References Cited

U.S. PATENT DOCUMENTS

| | | | |
|---|---|---|---|
| 6,302,964 B1* | 10/2001 | Umotoy | C23C 16/45514 118/715 |
| 10,023,959 B2* | 7/2018 | Sung | C23C 16/45574 |
| 2013/0341433 A1* | 12/2013 | Roy | C23C 16/45565 239/548 |
| 2017/0167024 A1 | 6/2017 | Wiltse et al. | |
| 2017/0362710 A1 | 12/2017 | Ge et al. | |

FOREIGN PATENT DOCUMENTS

WO   2017/173097   10/2017

* cited by examiner

*Primary Examiner* — Andrew Q Tran
(74) *Attorney, Agent, or Firm* — Weaver Austin Villeneuve & Sampson LLP

(57) ABSTRACT

Showerheads for independently delivering different, mutually-reactive process gases to a wafer processing space are provided. The showerheads include a first gas distributor that has multiple plenum structures that are separated from one another by a gap, as well as a second gas distributor positioned above the first gas distributor. Isolation gas from the second gas distributor may be flowed down onto the first gas distributor and through the gaps in between the plenum structures of the first gas distributor, thereby establishing an isolation gas curtain that prevents the process gases released from each plenum structure from parasitically depositing on the plenum structures that provide other gases.

20 Claims, 13 Drawing Sheets

SHOWERHEAD WITH AIR-GAPPED PLENUMS AND OVERHEAD ISOLATION GAS DISTRIBUTOR

BACKGROUND

Many semiconductor processing operations are performed within sealed semiconductor processing chambers in which a semiconductor wafer or other substrate is supported on a wafer support or pedestal underneath a gas distributor, commonly referred to as a "showerhead." Discussed herein are a new type of showerhead design for use in semiconductor processing equipment, in particular, in semiconductor processing equipment in which there may be sequential flows of multiple different types of semiconductor processing gasses, as is the case in atomic layer deposition (ALD) and other processes.

SUMMARY

Details of one or more implementations of the subject matter described in this specification are set forth in the accompanying drawings and the description below. Other features, aspects, and advantages will become apparent from the description, the drawings, and the claims.

In some implementations, an apparatus may be provided that includes a first gas distributor and a second gas distributor. The first gas distributor may include a plurality of plenum structures and multiple sets of gas distribution ports, each set of gas distribution ports connected with a corresponding plenum structure and each plenum structure including a corresponding plenum volume. The multiple sets of gas distribution ports may include a first set of first gas distribution ports and a second set of second gas distribution ports, and the plurality of plenum structures may include a first plenum structure including a first plenum volume and a second plenum structure including a second plenum volume. The first gas distribution ports may be connected with the first plenum structure and configured to direct gas flowed through the first gas distribution ports from the first plenum volume along a first average direction, while the second gas distribution ports may be connected with the second plenum structure and configured to direct gas flowed through the second gas distribution ports from the second plenum volume along a second average direction having a component aligned with the first average direction. The first plenum structure and the second plenum structure may be separated from each other by at least a first gap when viewed along the first average direction. The second gas distributor may include an isolation gas plenum volume and a plurality of isolation gas ports in fluidic communication with the isolation gas plenum volume and may be positioned such that the isolation gas ports are interposed between the isolation gas plenum volume and the first gas distributor. The isolation gas ports may be configured to flow gas flowed through the isolation gas ports from the isolation gas plenum volume towards the first gas distributor and through the first gap.

In some further implementations, the first gap may be at least 2 mm. In some further implementations, the first gap may be between 2 mm and 40 mm.

In some further implementations, the first plenum structure may include a first spiral tube and the second plenum structure may include a second spiral tube. The first spiral tube and the second spiral tube may lie in a common plane and may have substantially similar pitches and may be arranged in a radial array relative to one another.

In some further implementations, the first plenum structure and the second plenum structure may each be machined out of a plate of solid material and edges of the first plenum structure and the second plenum structure may be rounded with a radius of at least 1 mm.

In some further implementations, the apparatus may further include a plurality of structural supports, each structural support joining together two or more of the plenum structures.

In some further implementations, the plenum structures may be arranged in an equally-spaced radial array about a common center axis.

In some further implementations, each plenum structure may include one or more tubular structures extending along a corresponding one or more paths. In some further such implementations, each tubular structure may have an external cross-section in a plane perpendicular to the corresponding one or more paths at the location of the cross-section and such external cross-sections may, for example, be one or more of a circular cross-section, an obround cross-section, an ellipsoid cross-section, and a lachrymiform cross-section. In some further or alternative implementations, the first gap may vary along the one or more paths.

In some further implementations, the gas distribution ports connected with each plenum volume may be arranged along the corresponding one or more paths.

In some further implementations, each plenum volume in the first gas distributor may be fluidically connected by a corresponding flow passage with a corresponding gas inlet located such that the second gas distributor is interposed between the corresponding gas inlet and the first gas distributor. In some further such implementations, the first gas distributor and the second gas distributor may be configured to move relative to each other along the first av erage direction.

In some further implementations, each plenum structure may include a corresponding gas inlet, and the gas distribution ports arranged along each path may be spaced apart from one another by decreasing distances as a function of increasing flow path distance from the corresponding gas inlet.

In some further implementations, each plenum structure may include a corresponding gas inlet, and the gas distribution ports arranged along each path may generally increase in size as a function of increasing flow path distance from the corresponding gas inlet.

In some further implementations, the second gas distributor may have a back plate, a circumferential side wall, and a faceplate that define the isolation gas plenum volume; the circumferential side wall may be interposed between the back plate and the faceplate, and the isolation gas ports may be provided by a plurality of holes through, and distributed across, the faceplate.

In some implementations, the apparatus may further include a semiconductor processing chamber and a wafer support located within the semiconductor processing chamber; in such implementations, the first gas distributor and the second gas distributor may both be centered above the wafer support.

In some further implementations, the apparatus may further include an isolation gas source configured to provide isolation gas to the isolation gas plenum volume, a first process gas source configured to provide a first process gas to the first plenum volume, and a second process gas source configured to provide a second process gas to the second plenum volume. In such implementations, the first process gas and the second process gas may be different, and the isolation gas may be non-reactive with both the first process gas and the second process gas.

In some implementations, a method of using an apparatus such as those described above may be provided. In such methods, one or more process gases may be flowed out of the first gas distributor. During such process gas flow, an isolation gas may be simultaneously flowed through the second gas distributor. In some such implementations, the a first process gas may be flowed out of the first plenum volume while a second process gas is flowed out of the second plenum volume, and the first process gas and the second process gas may be reactive with one another.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

The various implementations disclosed herein are illustrated by way of example, and not by way of limitation, in the figures of the accompanying drawings, in which like reference numerals refer to similar elements.

Figure 1:
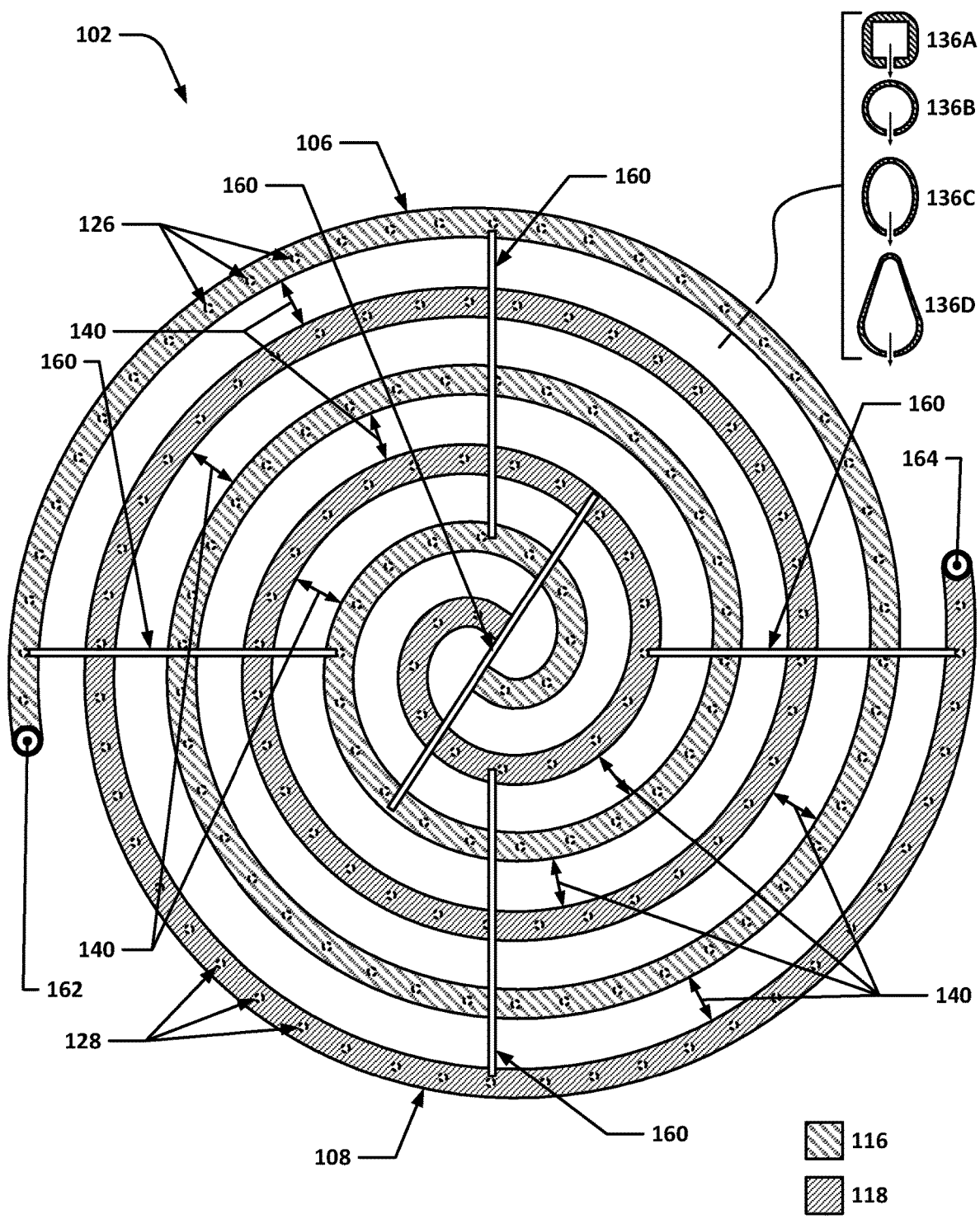
FIG. 1 is a top partial view of an example first gas distributor according to the present disclosure.

The Figures depict only an example of the concepts discussed herein, and it will be readily appreciated that the concepts discussed herein may be implemented in a large number of alternate implementations, all of which are considered to be within the scope of this disclosure.

DETAILED DESCRIPTION

Importantly, the concepts discussed herein are not limited to any single aspect or implementation discussed herein, nor to any combinations and/or permutations of such aspects and/or implementations. Moreover, each of the aspects of the present invention, and/or implementations thereof, may be employed alone or in combination with one or more of the other aspects and/or implementations thereof. For the sake of brevity, many of those permutations and combinations will not be discussed and/or illustrated separately herein.

The present inventors conceived of a new type of showerhead design for use in semiconductor processing operations that involve alternating applications of two or more different types of precursors or other semiconductor processing gases. For example, in atomic layer deposition (ALD), a semiconductor wafer may be dosed with repeated cycles of two separately-applied precursors, e.g. precursor A and precursor B. When precursor A is flowed across the wafer, a layer of precursor A may adsorb onto the semiconductor wafer. Precursor A is then flushed from the processing chamber (leaving behind the adsorbed precursor A) with a non-reactive purge gas, after which precursor B is flowed across the semiconductor wafer, whereupon precursor B reacts with precursor A in a self-limiting manner to form a single-molecule thick layer of material. Unreacted precursor B is then purged from the chamber with the non-reactive purge gas, and the process repeated as desired in order to build up, layer-by-layer, a desired thickness of material.

Because the precursors used in ALD operations react with one another upon mixing, they are typically kept physically and generally temporally isolated from one another within a showerhead/processing chamber. For example, an ALD showerhead may have two sets of gas distribution ports distributed across the faceplate, with each set of gas distribution ports fluidically connected with a different interior plenum volume of the showerhead that are each supplied with a different precursor gas. The present inventors, however, determined that such traditional showerhead arrangements are vulnerable to undesired reactions between the two precursors on the surface of the faceplate facing the wafer. More specifically, it was found that a portion of the precursor gases that exited such faceplates tended to recirculate or eddy slightly in the region around each gas distribution port, thereby causing precursor to adsorb onto the faceplate itself in addition to the semiconductor wafer. As a result, the faceplate would experience undesired deposition that would, over time and repeated wafer processing operations, build up and have adverse effects on the performance of the showerhead and could, potentially, cause damage or contamination to wafers being processed using that showerhead. In order to address such buildup, the showerhead would need to be subjected to cleaning operations or other processes necessary to restore the showerhead to its original dimensional state. Such operations introduce undesirable cost, both in terms of the cost of performing them and the production downtime experienced while they are being cleaned. Additionally, films deposited in some ALD operations may be resistant to cleaning using atomic fluorine, which is a cleaning gas that is usually used to remove undesired deposition material from semiconductor manufacturing equipment, or other cleaning techniques, e.g., dry etching generally, which means that the components to be cleaned must be removed and either replaced or subjected to mechanical cleaning operations, e.g., lapping, machining, etc., before being reinstalled.

It should be noted that the above examples have been discussed with respect to atomic layer deposition, but the principles and concepts discussed herein are generally applicable to any semiconductor processing operations or tools involved two or more gases or reactants that are kept isolated from one another until flowed across a semiconductor wafer, e.g., atomic layer etching (ALE), plasma enhanced chemical vapor deposition (PECVD), chemical vapor deposition (CVD), plasma enhanced atomic layer deposition (PEALD), and so forth.

In order to address such issues, the present inventors conceived of a new type of showerhead design including a first gas distributor in which each precursor is routed through a separate plenum structure that is generally in-plane with the other plenum structures in the first gas distributor but separated from each neighboring plenum structure by a gap, e.g., an air-gap (it will be understood that "air-gap" is used in this sense to refer to a gap with no solid material occupying it, rather than as a gap that has actual "air" in it—most semiconductor processing operations are performed in a vacuum or low-pressure environment, and such environments are usually kept free of atmospheric air to the extent possible). Such showerheads would additionally include a second gas distributor that has an isolation gas plenum structure with a plurality of isolation gas ports positioned above the first gas distributor so as to flow isolation gas over the first gas distributor and through the air gaps between the plenum structures in the first gas distributor. In doing so, a generally continuous curtain of isolation gas is created that flows in between the various precursor gases that are released from each plenum structure in the first gas distributor. Such an isolation gas curtain acts to keep the precursors released from one plenum structure in the first gas distributor from reaching the surfaces of the other plenum structures in the first gas distributor, thereby preventing possible mixing of the various precursors on the surfaces of the first gas distributor.

Additionally, the vertical distance between the first gas distributor and the second gas distributor may be adjusted in some implementations such that the flow of isolation gas has sufficient time to develop into laminar flow by the time it reaches the gas distribution ports of the plenum structures in the first gas distributor, thereby reducing the chance of eddies or recirculation near the surfaces of the plenum structures (and thus reducing the risk of the precursors adsorbing onto the surfaces of the plenum structures).

Isolation gas, it will be understood, is used herein to refer to a gas that is non-reactive with the various precursors that may be flowed through the plenum structures of the showerhead. Such isolation gases may, for example, include argon, nitrogen, and helium.

These concepts will be discussed in more detail below with reference to several example implementations.

FIG. 1 is a top partial view of an example first gas distributor according to the present disclosure. In FIG. 1, a first gas distributor 102 is shown that has a first plenum structure 106 defining a first plenum volume 116 that is fluidically connected with a plurality of first gas distribution ports 126 that allow a first process gas flowed through the first plenum volume 116 to be flowed out of the first plenum structure 106 in a first average direction, e.g., in a direction facing down into the page of FIG. 1 in this case. The first average direction may generally be in a downward, vertical direction. It will be understood that reference to gas flowing in an average direction, as the phrase is used herein, is inclusive of gas flow that generally flows in such an average direction. For example, if the first average direction is vertically downward, gas that flows "along" the first average direction may include gas that has an actual average gas flow direction that is different, e.g., ±10% or ±20% of the first average direction. The first gas distributor 102 also includes a second plenum structure 108 defining a second plenum volume 118 that is fluidically connected with a plurality of second gas distribution ports 128 that allow a second process gas flowed out of the second plenum structure 108 in a second average direction having a component aligned with the first average direction; in many such implementations, the first average direction and the second average direction may be substantially the same. In this example, the first plenum structure 106 and the second plenum structure 108 are both spiral-shaped, e.g., each consists of a tube that has been bent or curled into a spiral. As shown, the first plenum structure 106 may be supplied the first process gas through a first gas inlet 162 and the second plenum structure 108 may be supplied the second process gas through a second gas inlet 164. The plenum structures of the first gas distributor 102 may be connected to one another, for structural purposes, by one or more structural supports 160, which may be brazed, welded, or otherwise attached to the plenum structures. The structural supports may be kept relatively thin, e.g., on the order of a few millimeters, so as to avoid significantly disturbing or interfering with the flow of the isolation gas from the second gas distributor past the first gas distributor.

The first plenum structure 106 and the second plenum structure 108 shown in FIG. 1 are arranged in a radial array around a common center point. As a result, the first plenum structure 106 and the second plenum structure 108 are separated from each other by a first gap 140—this first gap 140 extends between the first plenum structure 106 and the second plenum structure 108 for substantially the entire length of either of the first plenum structure 106 and the second plenum structure 108. In FIG. 1, the first gap 140 remains constant along the entire lengths of the first plenum structure 106 and the second plenum structure 108, but in other implementations, the first gap 140 may be variable, for example, expanding or narrowing in size with increasing distance from the center of the first gas distributor. The first gap 140 may, for example, have a value or values between 2 mm and 40 mm in some implementations, between 4 mm and 36 mm in some implementations, between 6 mm and 32 mm in some implementations, between 8 mm and 28 mm in some implementations, between 10 mm and 24 mm in some implementations, between 12 mm and 20 mm in some implementations, and between 14 mm and 16 mm in some other implementations. Such first gap ranges may be applicable to any of the implementations discussed herein.

The gas distribution ports that are shown distributed along the length of each tube are, in this example, equally spaced from one another. In some implementations, the gas distribution ports may be differently configured, e.g., have gradually increasing or decreasing spacing or gradually increasing or decreasing diameter as a function of increasing flow path distance between the gas inlet for that gas plenum structure and the gas distribution ports, so as to adjust the flow rate of gas from each individual gas distribution port and thus adjust the uniformity of gas distribution across the surface of the semiconductor wafer.

The first plenum structure 106 and the second plenum structure 108 may have a variety of cross-sectional shapes. In some implementations, the first plenum structure 106 and the second plenum structure 108 may have a hollow square or squircle (square with rounded corners) shape, such as the cross-section 136A. In other implementations, the first plenum structure 106 and the second plenum structure 108 may have a round cross-section like in cross-section 136B or an oval cross-section 136C. In yet other implementations, the first plenum structure 106 and the second plenum structure 108 may have a lachrymiform, or tear-drop shaped, cross-section 136D (which, in some implementations, could have the cross-section reversed, with the larger-diameter portion oriented upwards and the smaller diameter portion oriented downwards; the gas distribution ports in this case would be located in the downward-oriented smaller-diameter portion).

Figure 2:
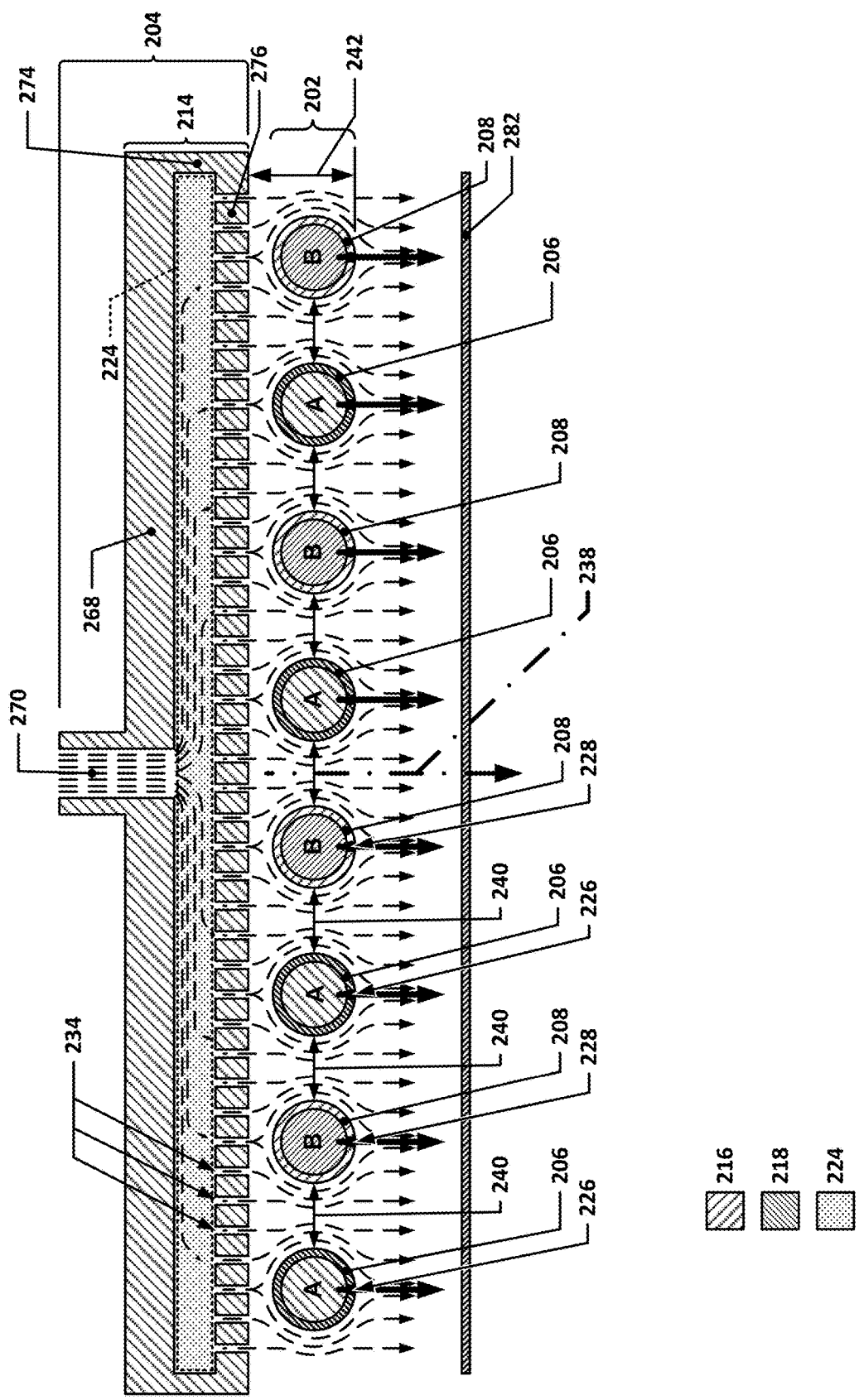
FIG. 2 is a side sectional view of an example first gas distributor and second gas distributor according to the present disclosure.

FIG. 2 is a side sectional view of an example first gas distributor and second gas distributor according to the present disclosure. In the apparatus of FIG. 2, a first gas distributor 202 is provided that is similar to that of FIG. 1; the apparatus also includes a second gas distributor 204 that is positioned above the first gas distributor 202. The first gas distributor 202 includes a first plenum structure 206 and a second plenum structure 208. The first plenum structure 206 defines a first plenum volume 216 and has a plurality of first gas distribution ports 226 connected thereto that are in fluidic communication with the first plenum volume 216. Similarly, the second plenum structure 208 defines a second plenum volume 218 and has a plurality of second gas distribution ports 228 connected thereto that are in fluidic communication with the second plenum volume 218. The first gas distribution ports 226 and second gas distribution ports 228 are generally configured to flow gas along a first average direction 238, e.g., downwards.

The second gas distributor 204 may, as shown in FIG. 2, include a faceplate 276, a circumferential sidewall 274, and a backplate 268 that define, in major part, an isolation gas structure 214 that includes isolation gas plenum volume 224. The backplate 268 may include an isolation gas inlet 270 through which isolation gas may be flowed into the isolation gas plenum volume 224 and then out through a plurality of isolation gas ports 234.

As can be seen in FIG. 2, the first plenum structure 206 is separated from the second plenum structure 208 by a first gap 240, and the exit plane of the first gas distribution ports 226 and the second gas distribution ports 228 is offset from the exit plane of the isolation gas ports 234 by a second gap 242. Isolation gas (dashed line arrows) may be flowed through the isolation gas plenum volume 224, out through the isolation gas ports 234, and past the first gas distributor 202. Due to the rounded cross-sectional shape of the first plenum structure 206 and the second plenum structure 208, the isolation gas may flow around them without generating much, if any, turbulent or recirculating flow, thereby reducing the chance of the process gases flowed from the first gas distributor 202 depositing on the surfaces thereof. The second gap 242 may, in some implementations, have a value in the range of 6 mm to 30 mm, although other implementations may, if desired, have other second gap values. Such values are also applicable to the other implementations discussed herein.

Figure 3:
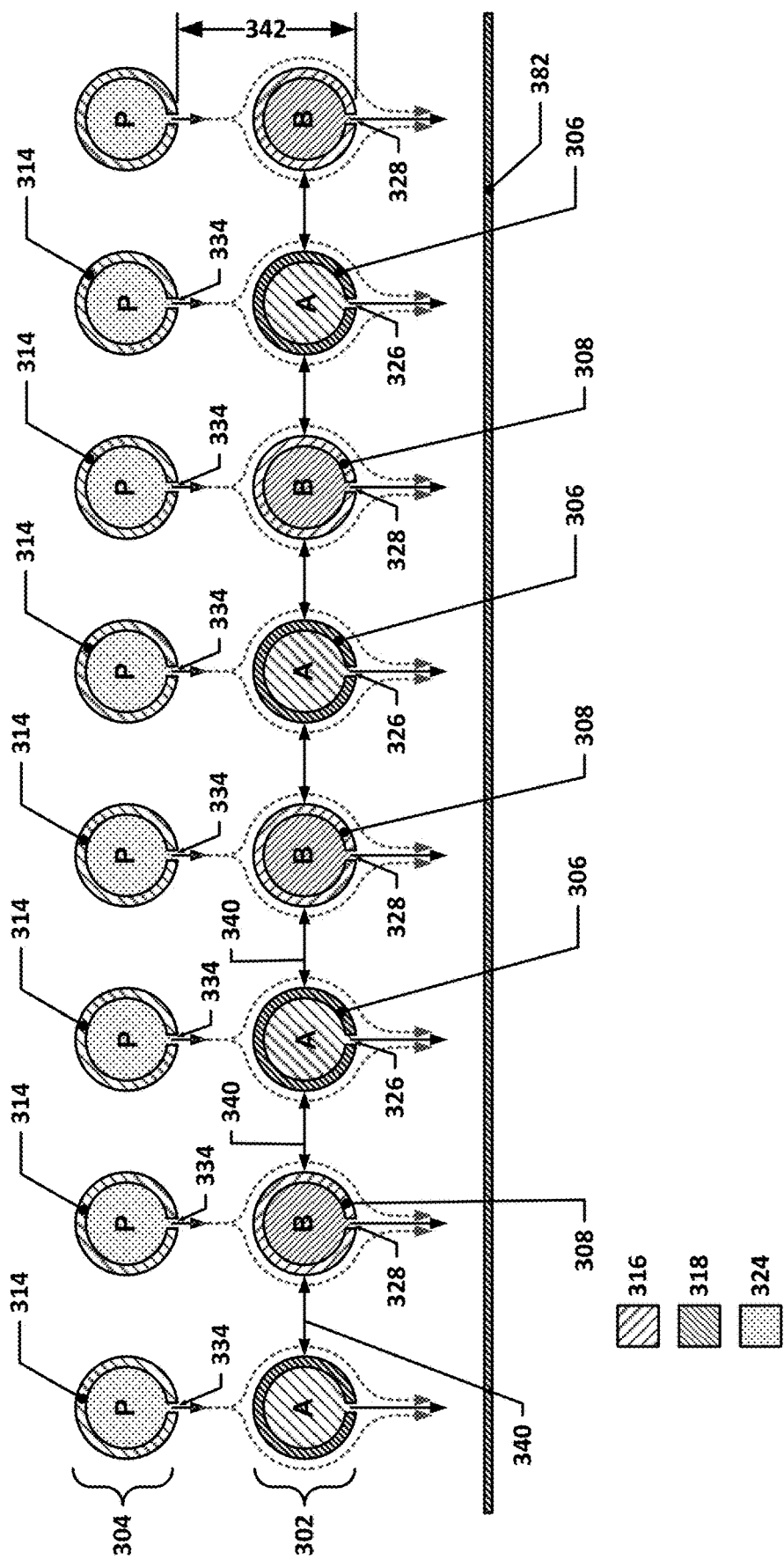
FIG. 3 is a side sectional view of an example first gas distributor and second gas distributor according to the present disclosure.

FIG. 3 is a side sectional view of an example first gas distributor and second gas distributor according to the present disclosure. The first gas distributor 302 is similar to the first gas distributor 202, and the discussion of the first gas distributor 202 provided earlier is equally applicable to the first gas distributor 302. The second gas distributor 304 is of a different design from the second gas distributor 204, and is, in effect, similar to the first gas distributor 302. Instead of two separate plenum volumes, however, the second gas distributor may have a single plenum volume 324 that is defined by an isolation gas plenum structure 314. For example, the isolation gas plenum structure 314 may look largely identical to the twin-spiral first plenum structure 106 and second plenum structure 108, except with the two plenum structures fluidically connected at the center, or may be fluidically separate from one another but fed the same isolation gas from two separate inlets. The isolation gas may then flow out through isolation gas ports 334 and onto/through the first gas distributor 302.

It will be appreciated that while the previous examples have used spiral plenum structures for the first gas distributor, the concepts discussed herein may be practiced using any of a variety of plenum structures. However, each plenum structure that is used should a) be arranged so as to distribute gas generally over the surface of a wafer and b) generally have a gap maintained between it and any neighboring plenum structure (used to provide a different type of process gas) when viewed along the first average direction, e.g., along the vertical direction.

Figure 4:
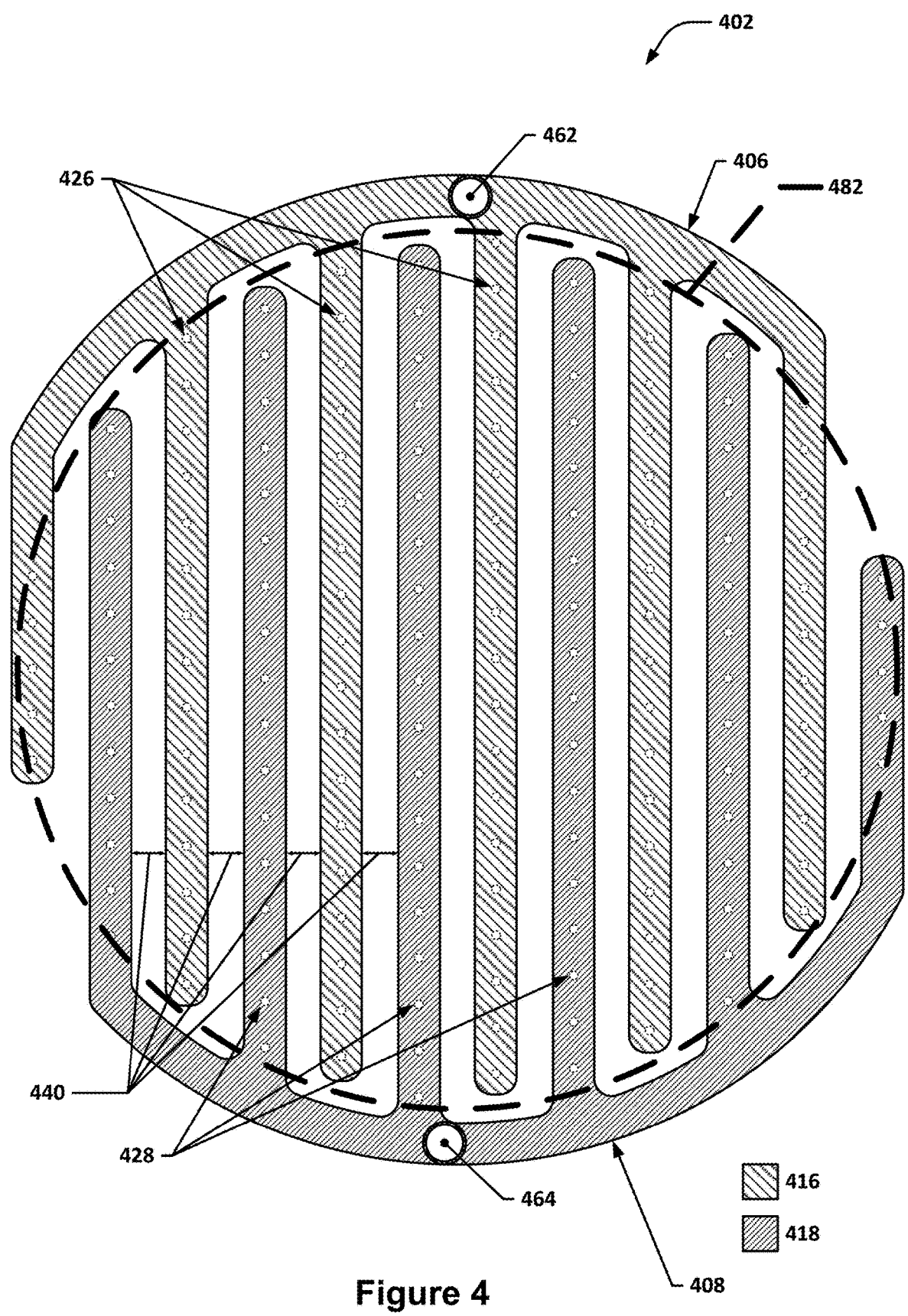
FIG. 4 is a top partial view of another example first gas distributor according to the present disclosure.

FIG. 4 is a top partial view of another example first gas distributor according to the present disclosure. The first gas distributor 402 of FIG. 4 has two arcuate, comb-shaped plenum structures, first plenum structure 406 and second plenum structure 408, that each include an arcuate passage that distributes gas from a first gas inlet 462 and a second gas inlet 464, respectively, to "finger" passages that are interleaved with one another and that include first gas distribution ports 426 and second gas distribution ports 428, respectively. The arcuate passages and finger passages for the first plenum structure 406 provide a first plenum volume 416, and the arcuate passages and finger passages for the second plenum structure 408 provide a second plenum volume 418. As can be seen, a first gap 440 is maintained between the first plenum structure 406 and the second plenum structure 408, although the first gap 440 varies in size in various locations, e.g., near the tips of each "finger."

Figure 5:
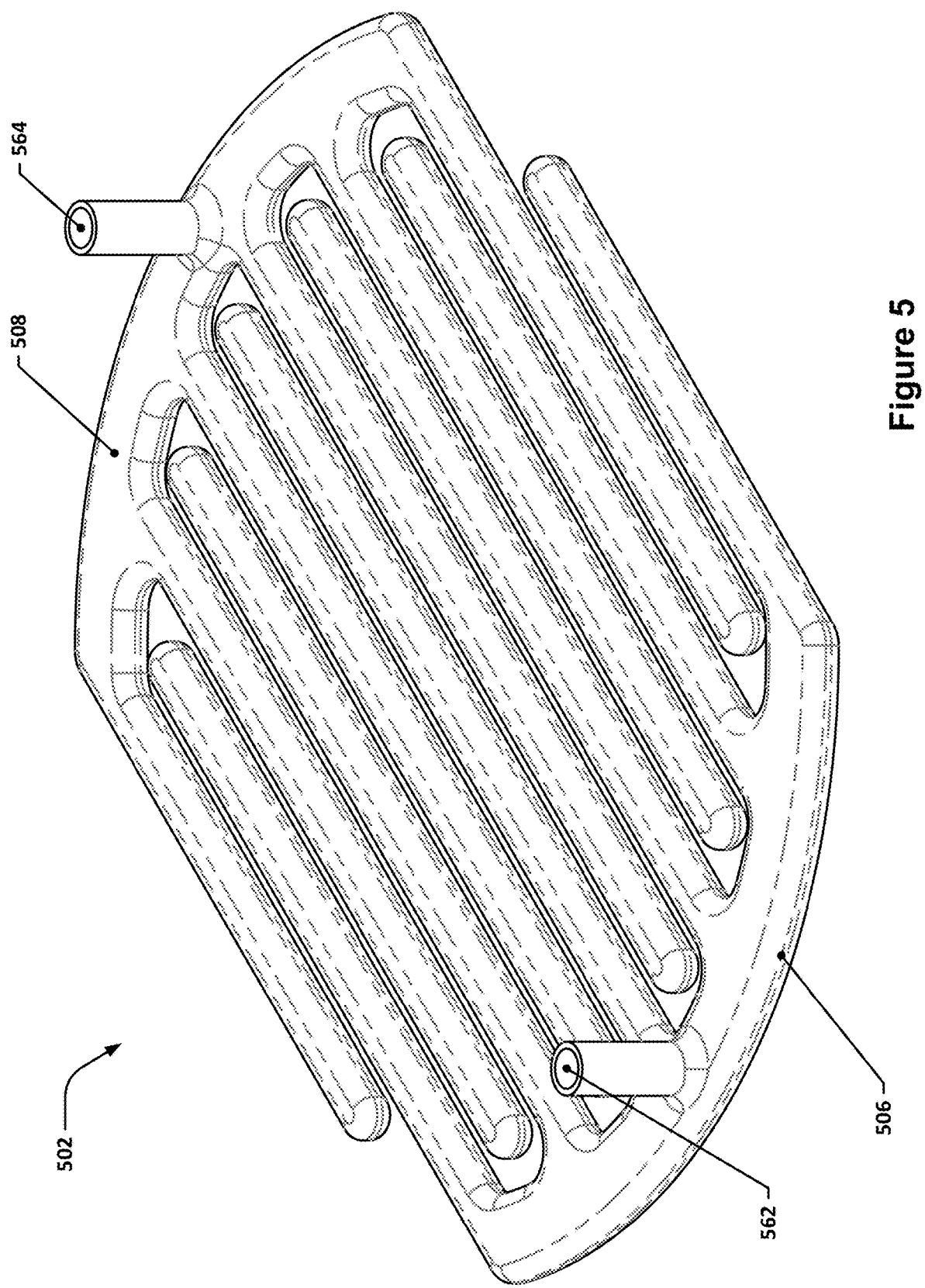
FIG. 5 is an isometric view of an example first gas distributor similar to that shown in FIG. 4.

FIG. 5 is an isometric view of an example first gas distributor similar to that shown in FIG. 4. In FIG. 5, the first gas distributor 502 includes, as with the first gas distributor 402, a first plenum structure 506 and a second plenum structure 508, each of which is supplied gas via a corresponding first gas inlet 562 or second gas inlet 564, respectively. In contrast to the spiral tube implementations discussed earlier, the implementation of FIG. 5 may, for example, be made by machining each plenum structure separately (as an upper and lower half, for example, to allow for the internal plenum volumes to be machined; the two halves may then be brazed or otherwise joined together into a single piece for each plenum structure). Such structures may be stiffer and more stable due to having potentially thicker wall thicknesses and shorter cantilevered lengths. In some implementations, such plenum structures may be additively manufactured, e.g., using direct laser metal sintering or a similar process, in order to manufacture each plenum structure as a single monolithic part. The gas distributors discussed herein may, as it is clear, be made from any of a variety of different machining or fabrication processes.

Figure 6:
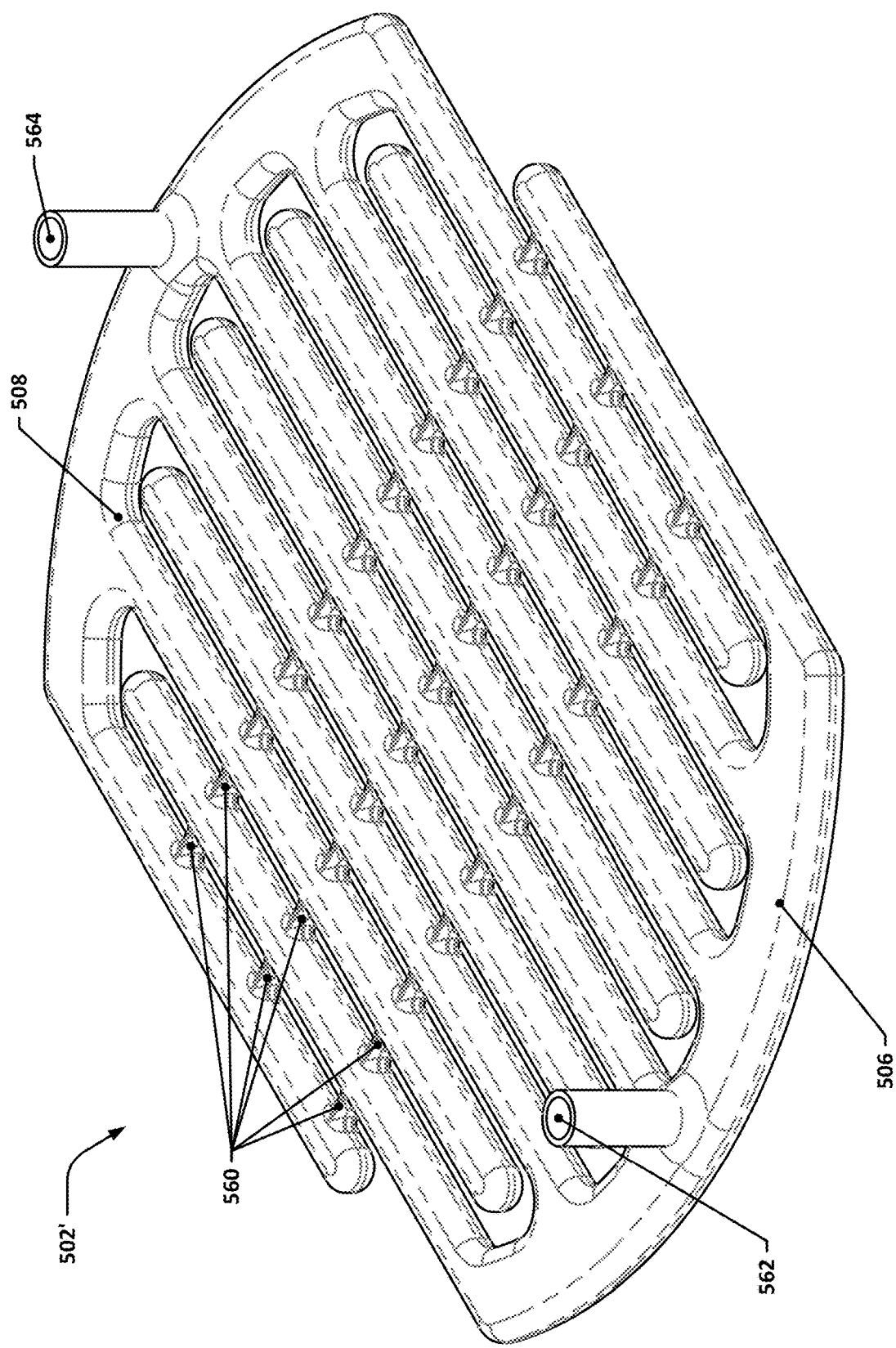
FIG. 6 is an isometric view of another example monolithic first gas distributor similar to that shown in FIG. 5, but as a monolithic structure.
Figure 7:
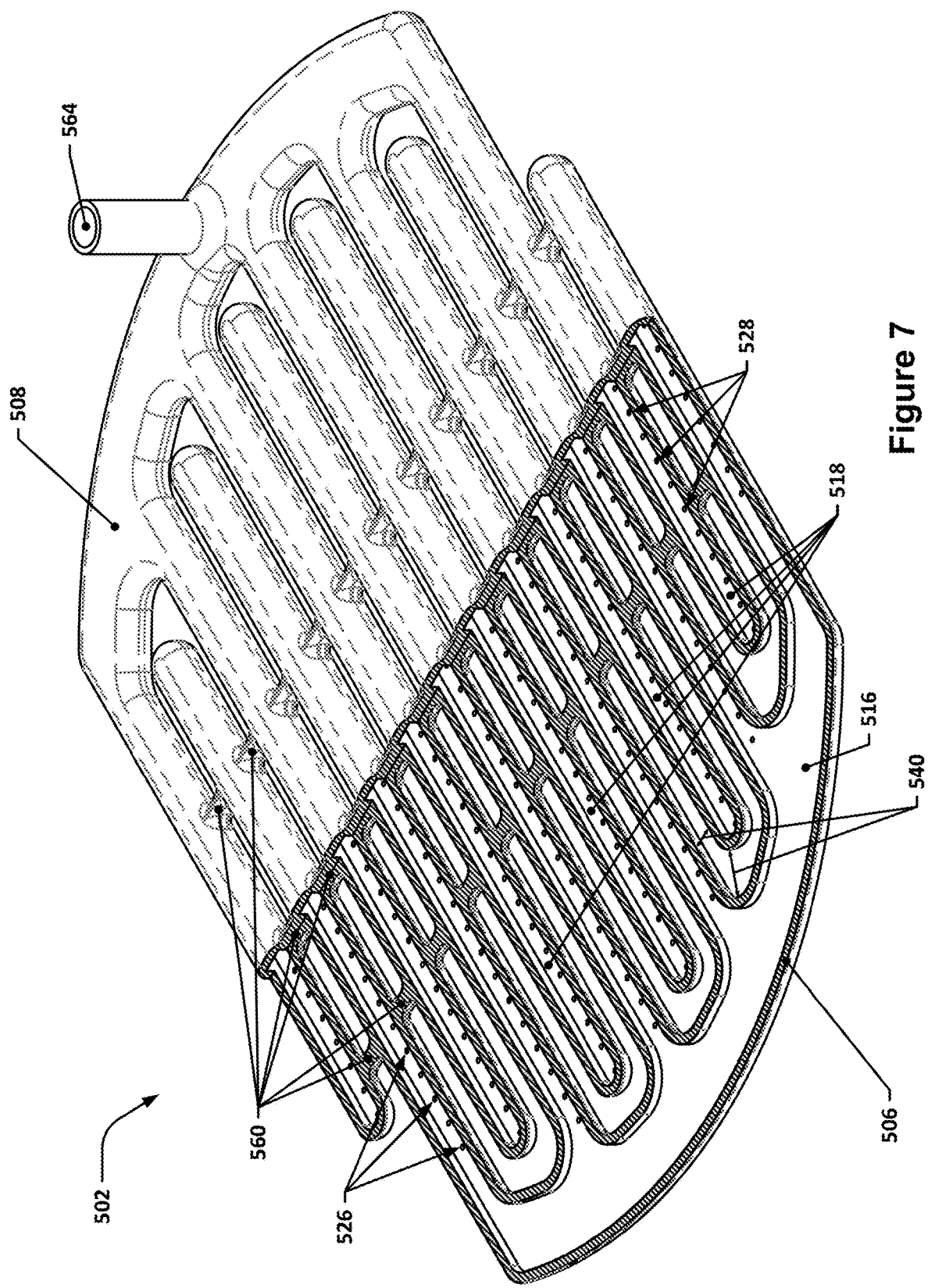
FIG. 7 is an isometric partial cutaway of the example monolithic first gas distributor of FIG. 6.

FIG. 6 is an isometric view of another example monolithic first gas distributor similar to that shown in FIG. 5, but as a monolithic structure. FIG. 7 is an isometric partial cutaway of the example monolithic first gas distributor of FIG. 6. In FIGS. 6 and 7, the only difference from FIG. 5 is that the first gas distributor 502' includes a plurality of structural supports 560 that span between the two plenum structures, forming a single, contiguous first gas distributor 502'. It will be understood that even though the first gas distributor 502' is a single contiguous part, the first plenum structure 506 and the second plenum structure 508 are still separated by a first gap 540 along their entire length. The structural supports 560 are to be understood as not being considered part of either plenum structure (even if contiguously joined thereto), but are instead linking or joining structures that bridge between the two plenum structures.

Figure 8:
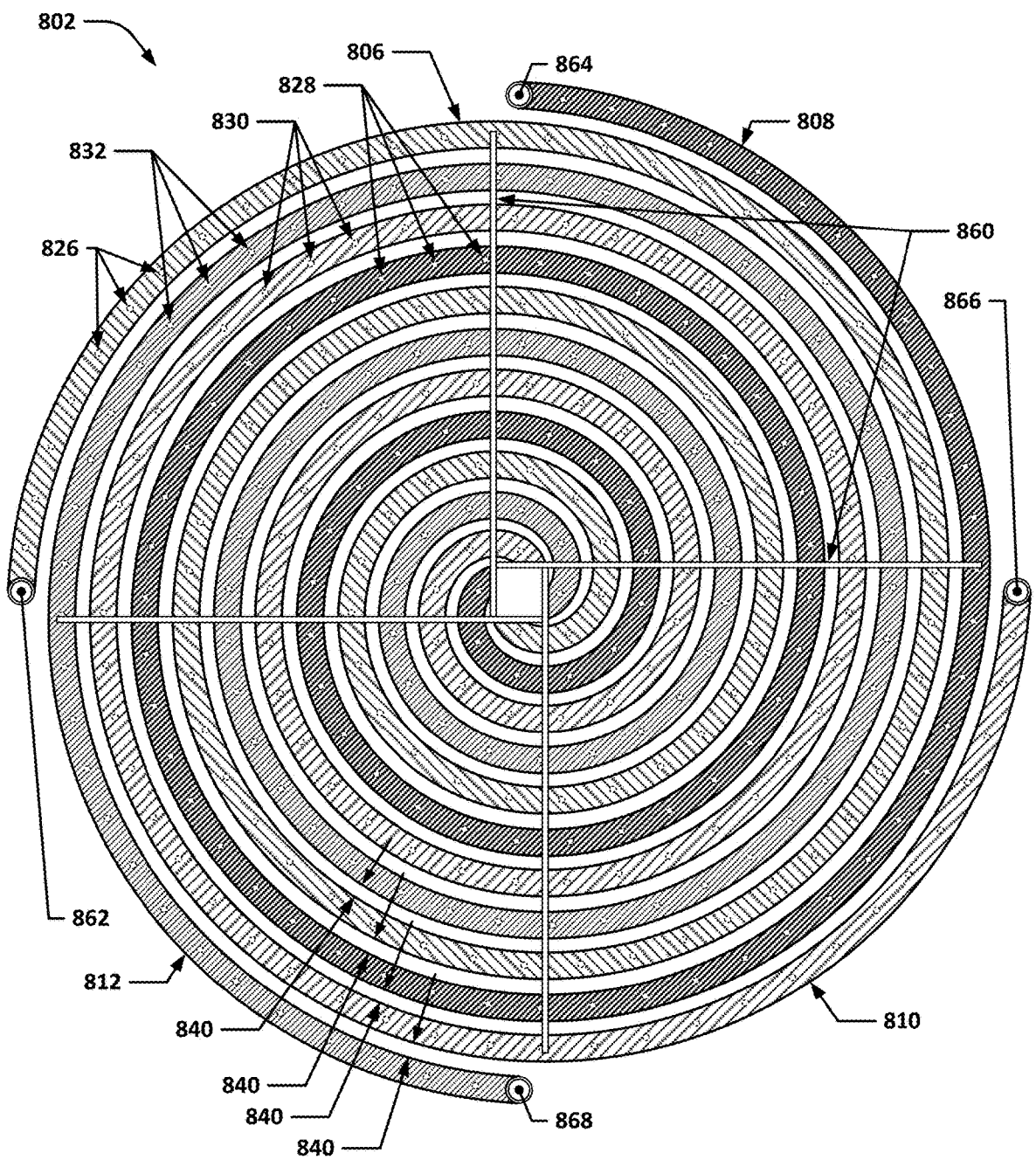
FIG. 8 is a top partial view of another example first gas distributor according to the present disclosure.

FIG. 8 is a top partial view of another example first gas distributor according to the present disclosure. The first gas distributor 802 that is shown in FIG. 8 is largely identical to that shown in FIG. 1, but with an additional two plenum structures included. Thus, the first gas distributor 802 includes a first plenum structure 806, a second plenum structure 808, a third plenum structure 810, and a fourth plenum structure 812 which define, respectively, a first plenum volume 816, a second plenum volume 818, a third plenum volume 820, and a fourth plenum volume 822. Each plenum volume is provided process gas via a corresponding gas inlet and distributes that process gas across a semiconductor wafer (the approximate footprint of which is indicated by dashed boundary 482) via a plurality of gas distribution ports. Thus, for example, the first plenum volume 816 is provided a first process gas via a first gas inlet 862 and then distributes the first process gas via first gas distribution ports 826, the second plenum volume 818 is provided a second process gas via a second gas inlet 864 and then distributes the second process gas via second gas distribution ports 828, the third plenum volume 820 is provided a third process gas via a third gas inlet 866 and then distributes the third process gas via third gas distribution ports 830, and the fourth plenum volume 822 is provided a fourth process gas via a fourth gas inlet 868 and then distributes the fourth process gas via fourth gas distribution ports 832.

In the first gas distributor 802, the various plenum structures are all supported relative to each other by structural supports 860, which may be welded, brazed, or otherwise connected to each plenum structure, thereby providing rigidity and support to the assembled first gas distributor 802 while interfering little, if at all, with the downward flow of isolation gas from a second gas distributor (not pictured) positioned above the first gas distributor 802. The isolation gas from the second gas distributor may flow between the plenum structures through the first gap 840 that exists between each adjoining pair of plenum structures, thus providing a continuous isolation gas curtain in between each plenum structure. Such isolation gas curtains may generally "wall off" each plenum structure from the gases flowed out of adjacent plenum structures, thereby preventing such gases from mixing and forming unwanted deposition products on the underside of the plenum structures. The isolation gas flow may also act to reduce or prevent recirculation of the process gases flowed from each plenum structure, thereby preventing or mitigating the adsorption of those process gases onto the underside of the plenum structures in the first place.

Figure 9:
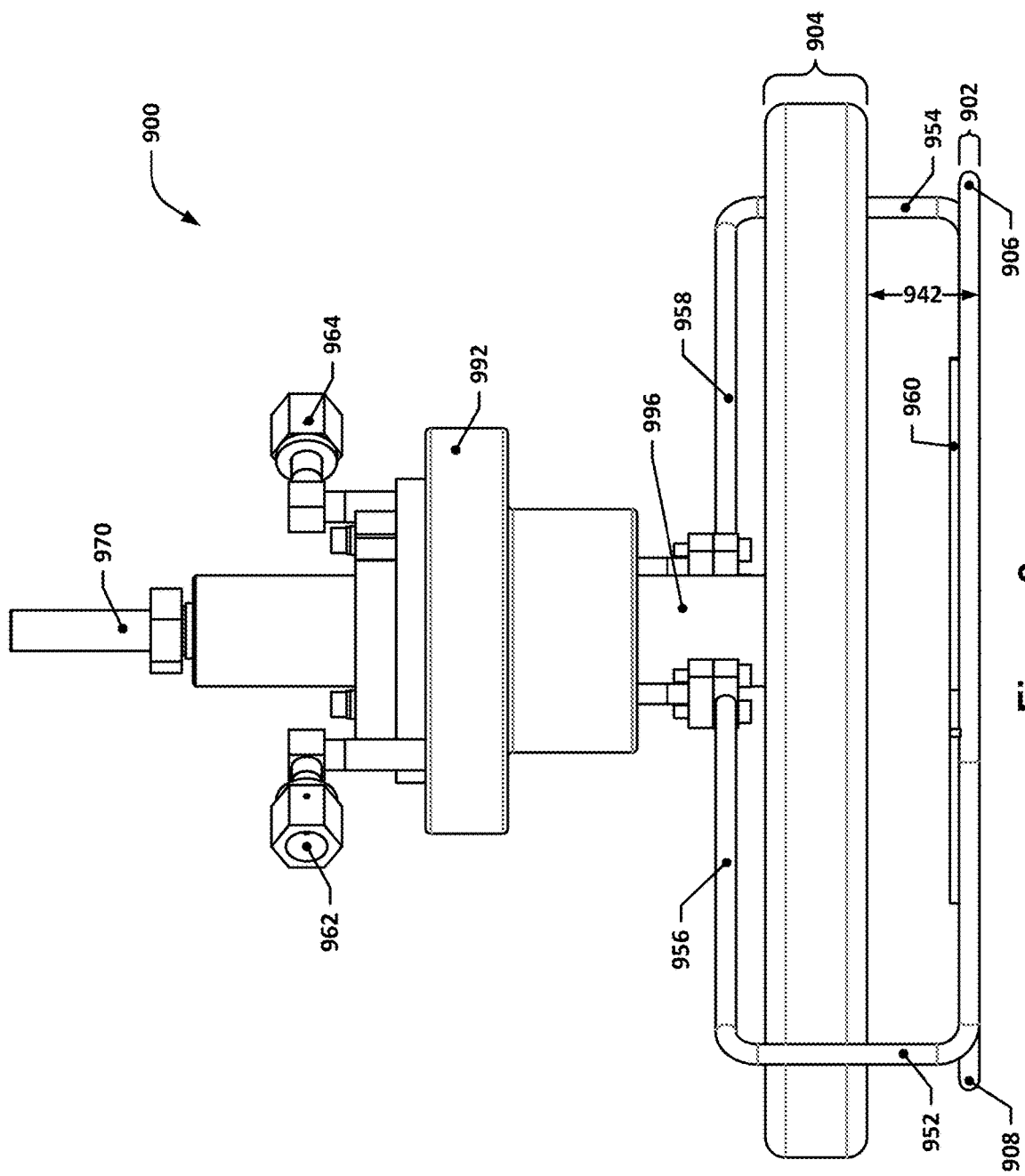
FIG. 9 is a side view of an example gas distribution system that incorporates the concepts discussed within this disclosure.
Figure 10:
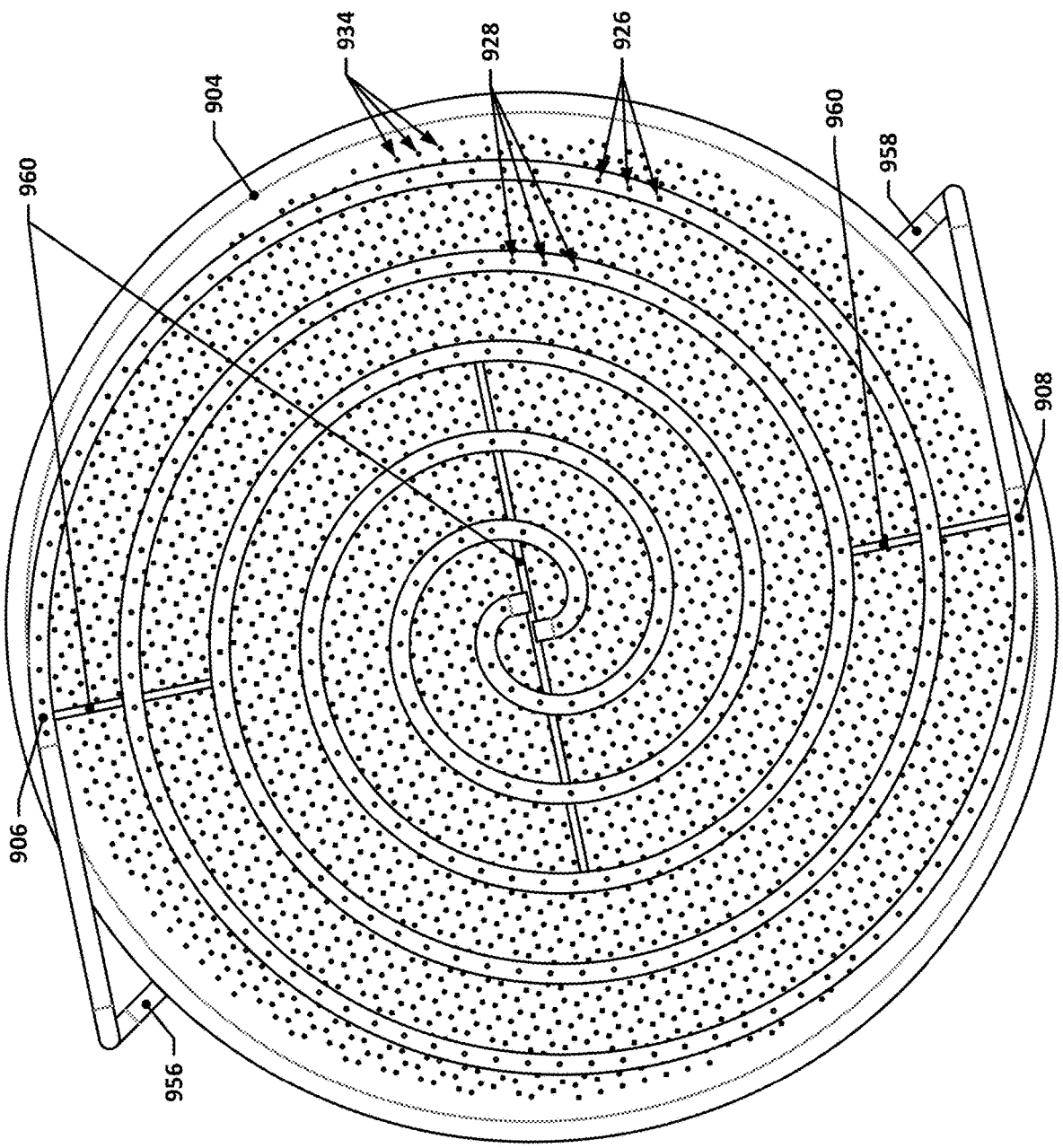
FIG. 10 is a bottom view of the example gas distribution system of FIG. 9.
Figure 11:
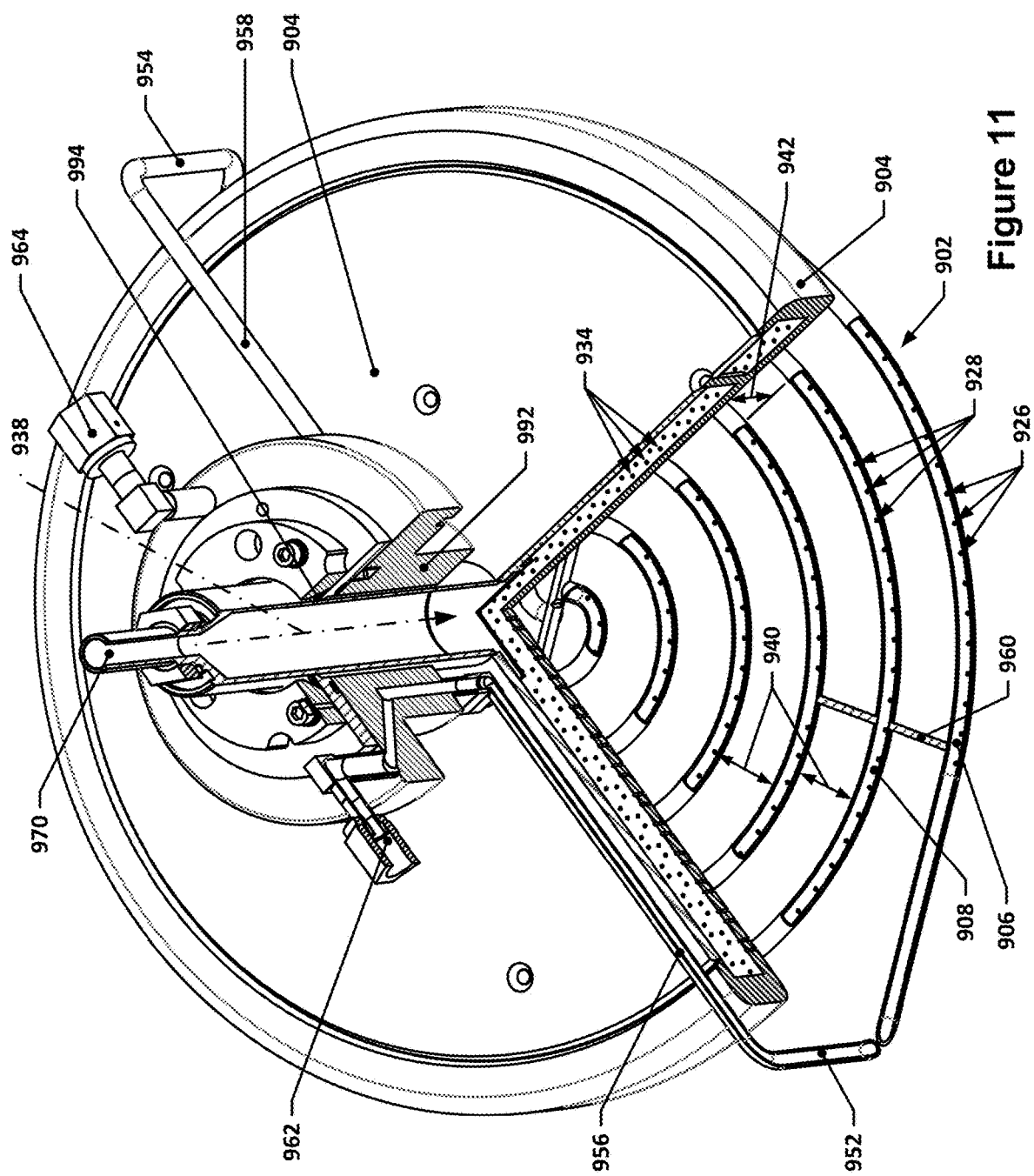
FIG. 11 is a perspective partial cutaway view of the example gas distribution system of FIG. 9.

FIG. 9 is a side view of an example gas distribution system that incorporates the concepts discussed within this disclosure. FIG. 10 is a bottom view of the example gas distribution system of FIG. 9. FIG. 11 is a perspective partial cutaway view of the example gas distribution system of FIG. 9.

As can be seen in FIG. 9, an apparatus 900 is provided that includes a first gas distributor 902 and a second gas distributor 904. The first gas distributor 902 includes a first plenum structure 906 that is provided a first process gas via a tube with a first riser segment 952 and a first radial segment 956 that are fluidically connected with a first gas inlet 962. The first gas distributor 902 similarly includes a second plenum structure 908 that is provided a second process gas via a tube with a second riser segment 954 and a second radial segment 958 that are fluidically connected with a second gas inlet 964. The process gases flowed into the first plenum structure 906 and the second plenum structure 908 may be flowed out of those respective plenum structures by corresponding first gas distribution ports 926 and second gas distribution ports 928, respectively. The first plenum structure 906 and the second plenum structure 908 may be separated from one another by a first gap 940 when viewed along a first average direction 938, e.g., downwards. The first average direction 938 may, for example, be defined by the average flow direction of the gas exiting the first gas distributor or, more generally, as substantially vertical.

The first plenum structure 906 and the second plenum structure 908 may optionally be supported relative to one another by structural supports 960, which may, for example, be thin, e.g., 0.1"±0.05", strips of metal that are welded or brazed to the plenum structures. In spiral-type plenum structures such as those depicted, such structural supports 960 may provide additional stiffness that may counteract sagging and flexing in the spiral tube structures (since the spiral tubes are, in effect, cantilevered beams of a length equal to the spiral length, they may experience significant deflection unless provided with intermediate support, e.g., such as with the structural supports 960).

The second plenum structure 908 may, for example, be a showerhead having a faceplate having a plurality of isolation gas ports 934. The second plenum structure may be supported by way of a support column 996 that also acts as a conduit for conducting isolation gas from an isolation gas inlet 970 to an isolation gas plenum inside of the second gas distributor 904 so that the isolation gas may then flow out through the isolation gas ports 934.

In the implementation shown, the support column 996 is a separate component from collar 992, which provides flow paths to connect the first gas inlet 962 and the second gas inlet 964 with the respective first radial segment 956 and second radial segment 958. This allows the second gas distributor 904 to be raised and lowered vertically relative to the first gas distributor 902, thereby increasing or decreasing a second gap 942 that exists between the exit plane of the first gas distribution ports 926 and the second gas distribution ports 928 and the exit plane of the isolation gas ports 934. A seal 994 may be provided to allow for an gas-tight sliding interface between the support column 996 and the collar 992.

Figure 12:
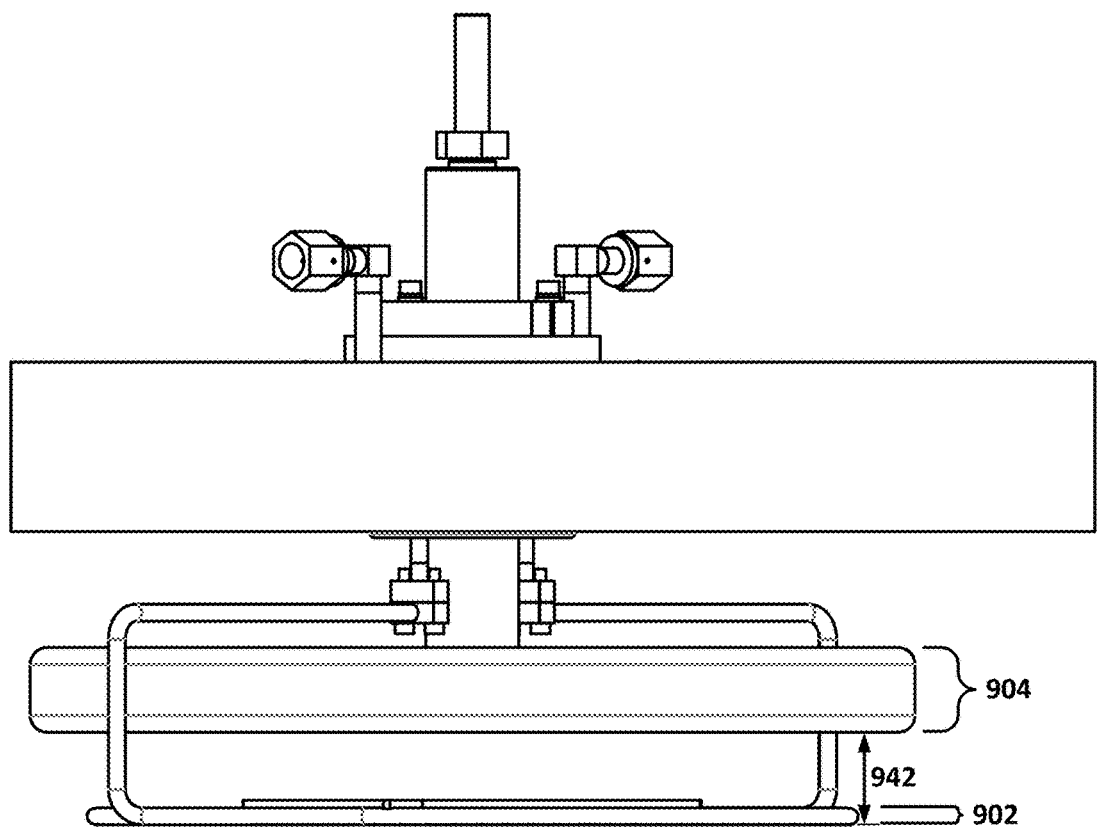
FIG. 12 is side view of the example gas distribution system of FIG. 9 with a second gas distributor in a raised state.
Figure 13:
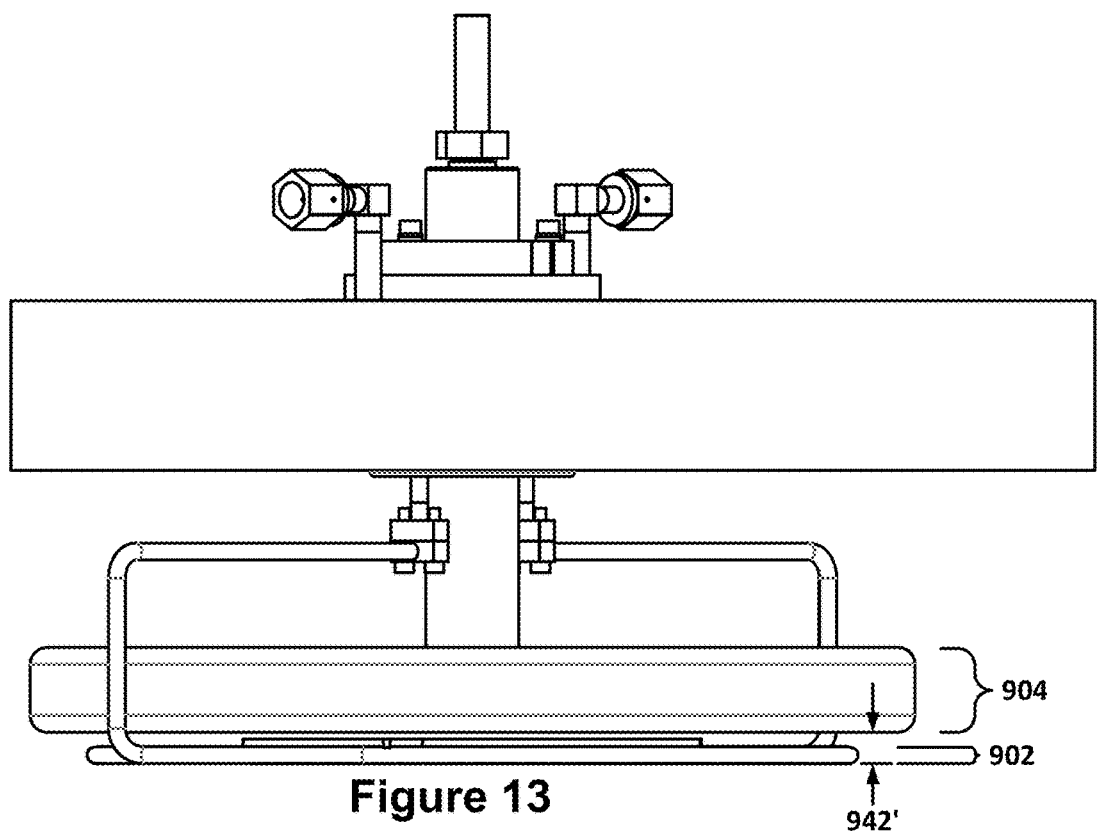
FIG. 13 is side view of the example gas distribution system of FIG. 9 with the second gas distributor in a lowered state.

FIG. 12 is side view of the example gas distribution system of FIG. 9 with a second gas distributor in a raised state. FIG. 13 is side view of the example gas distribution system of FIG. 9 with the second gas distributor in a lowered state. As discussed above, the implementation of FIGS. 9-11 may be adjusted so as to lower or raise the second gas distributor 904 relative to the first gas distributor 902. In other implementations, the first gas distributor 902 may be movable and the second gas distributor 904 may be fixed so as to provide such adjustment, or both the first gas distributor 902 and the second gas distributor 904 may be movable vertically. In some further implementations, the second gap 942 may not be adjustable, e.g., the second gap 942 may be fixed in size.

Thus, for example, the second gap 942 may be adjusted from the near-maximum second gap 942 shown in FIG. 12 to the near-minimum second gap 942' shown in FIG. 13

(with maximum and minimum evaluated based on the depicted configuration; other implementations may have other maximums and minimums).

The apparatus discussed in this application may be part of a larger apparatus or system, e.g., a semiconductor processing chamber. In some implementations, several instances of the apparatus implementations discussed herein may be used in a larger apparatus or system, e.g., a semiconductor processing tool having multiple such semiconductor processing chambers, each with its own first and second gas distributors as discussed herein.

Figure 14:
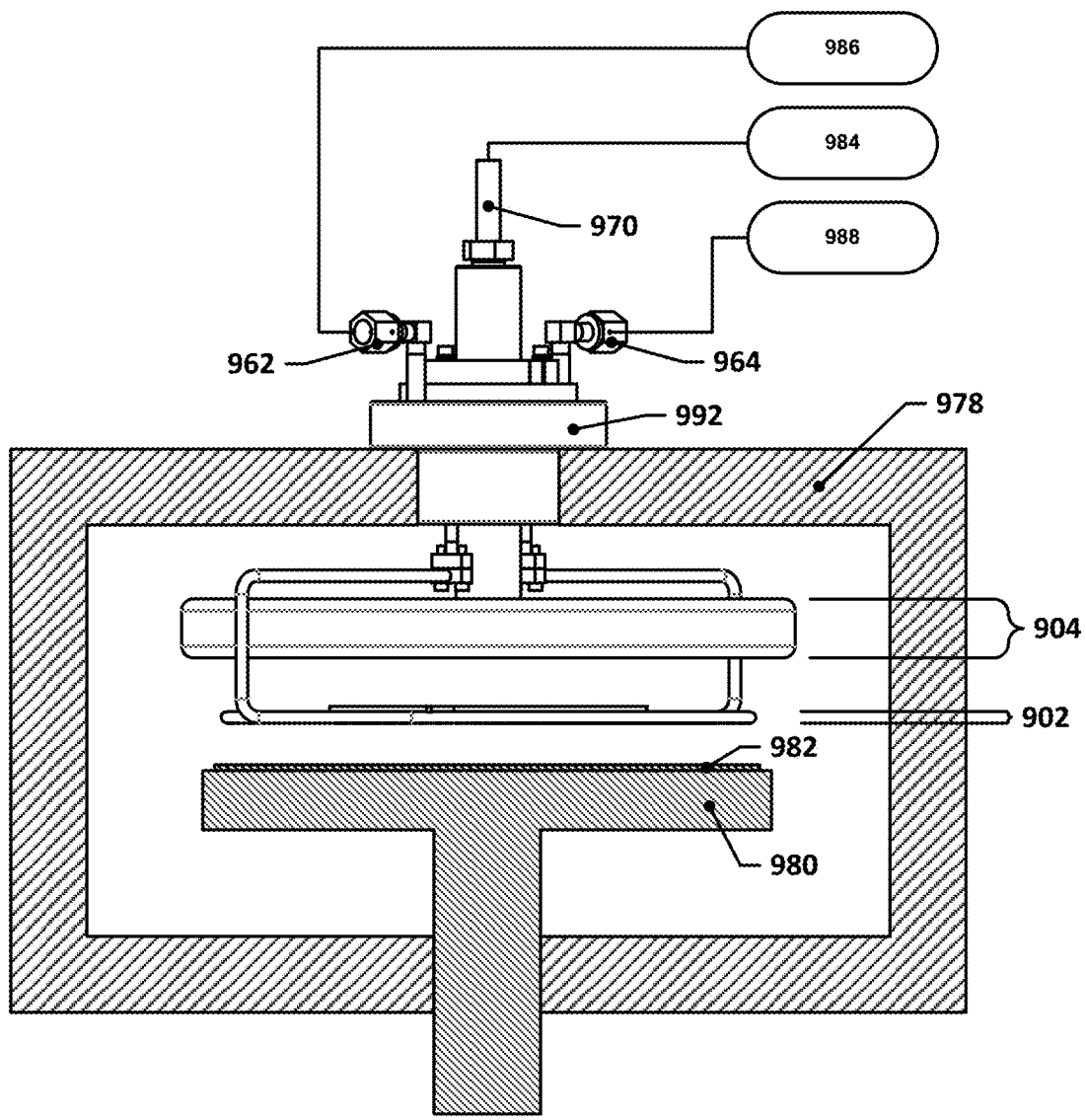
FIG. 14 is side view of the example gas distribution system of FIG. 9 installed in a semiconductor processing chamber.

FIG. 14 is side view of the example gas distribution system of FIG. 9 installed in a semiconductor processing chamber. In FIG. 14, the collar 992 is installed in a semiconductor processing chamber 978, allowing the first gas distributor 902 and the second gas distributor 904 to be suspended within the semiconductor processing chamber 978 over a wafer support or pedestal 980, which may be used to support a semiconductor wafer or other substrate 982 below the first gas distributor 902. When fully installed, the first gas inlet 962 may be fluidically connected with a first process gas source 986, the second gas inlet 964 may be fluidically connected with a second process gas source 988, and the isolation gas inlet 970 may be fluidically connected with an isolation gas source 984. The flow paths from each gas source to their respective inlets may be controlled by one or more valves to allow the flow of the gases into the various plenums to be separately controlled.

In some implementations, a controller may be included which may be part of the above-described examples. Such systems may include semiconductor processing equipment, including a processing tool or tools, chamber or chambers, a platform or platforms for processing, and/or specific processing components (a wafer pedestal, a gas flow system, etc.) in addition to the first gas distributor and second gas distributors discussed herein. These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

For example, in some implementations, the controller may be configured to operate computer-operable valves to control the flow of gas from the various gas sources discussed above, e.g., valves located along the flow paths indicated in FIG. 14. For example, the controller may cause isolation gas from the isolation gas source 984 to begin flowing through the isolation gas plenum volume for a predetermined period of time before causing either the first process gas from the first process gas source 986 or the second process gas from the second process gas source 988 to start flowing through their respective plenum volumes, thus establishing a stable flow in the isolation gas curtain that flows through the first gaps between the first plenum structure 906 and the second plenum structure 908. After such stable flow has been reached, the controller may control the valves controlling the first process gas flow and the second process gas flow so that the first process gas and the second process gas are alternately delivered to their respective plenum volumes. For example, the controller may cause a valve controlling the first process gas flow to enter into an open state for a predetermined period of time, e.g., hundredths of seconds to potentially several seconds, while causing a similar valve controlling the second process gas flow to enter into a closed state during that same time interval. The controller may then cause the valve controlling the first process gas flow to enter into a closed state, thereby ceasing the flow of the first process gas into the respective plenum volume. The controller may then, in some implementations, keep both valves controlling the first and second process gases in a closed state for another predetermined period of time to allow the isolation gas to isolation the space above the wafer of any resident first process gas. The controller may then cause the valve controlling the second process gas flow to enter into an open state for a second time interval while causing the valve controlling the first process gas flow to enter into or remain in a closed state. After the second process gas has been delivered for that second time interval, the controller may then, in some implementations, cause the valves for both the first process gas and the second process gas to enter into a closed state while the isolation gas valve is kept open, thereby purging the space above the wafer of any resident second process gas. This cycle may be repeated multiple times until the semiconductor processing operation is completed.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

It is to be understood that the term "set," unless further qualified, refers to a set of one or more items—it does not require that multiple items be present unless there is further language that implies that it does. For example, a "set of two or more items" would be understood to have, at a minimum, two items in it. In contrast, a "set of one or more items" would be understood to potentially only have one item in it. In a similar vein, it is to be understood that the term "each" may be used herein to refer to each member of a set, even if the set only includes one member. The term "each" may also be used in the same manner with implied sets, e.g., situations in which the term set is not used but other language implies that there is a set. For example, "each item of the one or more items" is to be understood to be equivalent to "each item in the set of one or more items."

It is to be understood that the above disclosure, while focusing on a particular example implementation or implementations, is not limited to only the discussed example, but may also apply to similar variants and mechanisms as well, and such similar variants and mechanisms are also considered to be within the scope of this disclosure.

What is claimed is:

1. An apparatus comprising:
   a first gas distributor including:
      a plurality of plenum structures and multiple sets of gas distribution ports, each set of gas distribution ports connected with a corresponding plenum structure and each plenum structure including a corresponding plenum volume, wherein:
         the multiple sets of gas distribution ports include a first set of first gas distribution ports and a second set of second gas distribution ports,
         the plurality of plenum structures includes a first plenum structure including a first plenum volume and a second plenum structure including a second plenum volume,
         the first gas distribution ports are connected with the first plenum structure and configured to direct gas flowed through the first gas distribution ports from the first plenum volume along a first average direction,
         the second gas distribution ports are connected with the second plenum structure and configured to direct gas flowed through the second gas distribution ports from the second plenum volume along a second average direction having a component aligned with the first average direction, and
         the first plenum structure and the second plenum structure are separated from each other by at least a first gap when viewed along the first average direction; and
   a second gas distributor including an isolation gas plenum volume and a plurality of isolation gas ports in fluidic communication with the isolation gas plenum volume, wherein:
      the second gas distributor is positioned such that the isolation gas ports are interposed between the isolation gas plenum volume and the first gas distributor, and
      the isolation gas ports are configured to flow gas flowed through the isolation gas ports from the isolation gas plenum volume towards the first gas distributor and through the first gap.

2. The apparatus of claim 1, wherein the first gap is at least 2 mm.

3. The apparatus of claim 1, wherein the first gap is between 2 mm and 40 mm.

4. The apparatus of claim 1, wherein:
   the first plenum structure includes a first spiral tube and the second plenum structure includes a second spiral tube,
   the first spiral tube and the second spiral tube lie in a common plane, and
   the first spiral tube and the second spiral tube have substantially similar pitches and are arranged in a radial array relative to one another.

5. The apparatus of claim 1, wherein the first plenum structure and the second plenum structure are each machined out of a plate of solid material and edges of the first plenum structure and the second plenum structure are rounded with a radius of at least 1 mm.

6. The apparatus of claim 1, further comprising a plurality of structural supports, each structural support joining together two or more of the plenum structures.

7. The apparatus of claim 1, wherein the plenum structures are arranged in an equally-spaced radial array about a common center axis.

8. The apparatus of claim 1, wherein each plenum structure is comprised of one or more tubular structures extending along a corresponding one or more paths.

9. The apparatus of claim 8, wherein each tubular structure has an external cross-section in a plane perpendicular to the corresponding one or more paths at the location of the cross-section that is selected from the group consisting of: a circular cross-section, an obround cross-section, an ellipsoid cross-section, and a lachrymiform cross-section.

10. The apparatus of claim 8, wherein the first gap varies along the one or more paths.

11. The apparatus of claim 8, wherein the gas distribution ports connected with each plenum volume are arranged along the corresponding one or more paths.

12. The apparatus of claim 11, wherein:
each plenum structure includes a corresponding gas inlet, and
the gas distribution ports arranged along each path are spaced apart from one another by decreasing distances as a function of increasing flow path distance from the corresponding gas inlet.

13. The apparatus of claim 11, wherein:
each plenum structure includes a corresponding gas inlet, and
the gas distribution ports arranged along each path generally increase in size as a function of increasing flow path distance from the corresponding gas inlet.

14. The apparatus of claim 1, wherein each plenum volume in the first gas distributor is fluidically connected by a corresponding flow passage with a corresponding gas inlet located such that the second gas distributor is interposed between the corresponding gas inlet and the first gas distributor.

15. The apparatus of claim 14, wherein the first gas distributor and the second gas distributor are configured to move relative to each other along the first average direction.

16. The apparatus of claim 1, wherein:
the second gas distributor has a back plate, a circumferential side wall, and a faceplate that define the isolation gas plenum volume,
the circumferential side wall is interposed between the back plate and the faceplate, and
the isolation gas ports are provided by a plurality of holes through, and distributed across, the faceplate.

17. The apparatus of claim 1, further comprising:
a semiconductor processing chamber; and
a wafer support located within the semiconductor processing chamber, wherein:
the first gas distributor and the second gas distributor are centered above the wafer support.

18. The apparatus of claim 17, further comprising:
an isolation gas source configured to provide isolation gas to the isolation gas plenum volume;
a first process gas source configured to provide a first process gas to the first plenum volume; and
a second process gas source configured to provide a second process gas to the second plenum volume, wherein:
the first process gas and the second process gas are different, and
the isolation gas is non-reactive with the first process gas and the second process gas.

19. A method comprising:
flowing one or more process gases out of a first gas distributor, the first gas distributor including:
a plurality of plenum structures and multiple sets of gas distribution ports, each set of gas distribution ports connected with a corresponding plenum structure and each plenum structure including a corresponding plenum volume, wherein:
the multiple sets of gas distribution ports include a first set of first gas distribution ports and a second set of second gas distribution ports,
the plurality of plenum structures includes a first plenum structure including a first plenum volume and a second plenum structure including a second plenum volume,
the first gas distribution ports are connected with the first plenum structure and configured to direct gas flowed through the first gas distribution ports from the first plenum volume along a first average direction,
the second gas distribution ports are connected with the second plenum structure and configured to direct gas flowed through the second gas distribution ports from the second plenum volume along the first average direction, and
the first plenum structure and the second plenum structure are separated from each other by at least a first gap when viewed along the first average direction; and
flowing an isolation gas out of a second gas distributor while process gas is flowed out of the first gas distributor, the second gas distributor including an isolation gas plenum volume and a plurality of isolation gas ports in fluidic communication with the isolation gas plenum volume, wherein:
the second gas distributor is positioned such that the isolation gas ports are interposed between the isolation gas plenum volume and the first gas distributor, and
the isolation gas ports are configured to flow gas flowed through the isolation gas ports from the isolation gas plenum volume towards the first gas distributor and through the first gap.

20. The method of claim 19, wherein:
a first process gas is flowed out of the first plenum volume through the first gas distribution ports while a second process gas is flowed out of the second plenum volume through the second gas distribution ports, and
the first process gas is reactive with the second process gas.

* * * * *